(12) United States Patent
Kim et al.

(10) Patent No.: US 6,396,106 B2
(45) Date of Patent: May 28, 2002

(54) THIN FILM TRANSISTOR AND FABRICATING METHOD THEREOF

(75) Inventors: Dong Hee Kim; Kyo Ho Moon, both of Daeku-shi (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/742,090

(22) Filed: Dec. 22, 2000

(30) Foreign Application Priority Data

Dec. 30, 1999 (KR) ............................................. 99-66040

(51) Int. Cl.[7] ..................... H01L 27/01; H01L 27/12; H01L 31/092
(52) U.S. Cl. ........................... 257/351; 257/71; 257/296
(58) Field of Search ........................... 257/71, 296, 347, 257/351

(56) References Cited

U.S. PATENT DOCUMENTS

| | | | | |
|---|---|---|---|---|
| 6,121,652 A | * | 9/2000 | Suzawa | 257/296 |
| 6,335,555 B1 | * | 1/2001 | Takemura et al. | 257/408 |
| 6,222,234 B1 | * | 4/2001 | Imai | 257/347 |
| 6,294,834 B1 | * | 9/2001 | Yeh et al. | 257/758 |

\* cited by examiner

Primary Examiner—Ngân V. Ngô
(74) Attorney, Agent, or Firm—Long Aldridge & Norman LLP

(57) ABSTRACT

A thin film transistor and a fabricating method thereof are adaptive for increasing a capacitance of a storage capacitor. In the method, a gate electrode and a lower electrode of a capacitor are formed at the transistor area and the capacitor area of an insulating substrate, respectively. A gate insulating film, an active layer and an ohmic contact layer on the insulating substrate is sequentially formed to cover the gate electrode and the lower electrode. The ohmic contact layer and the active layer are primarily patterned in such a manner as to be left only at a portion corresponding to the gate electrode of the transistor area and thus expose the gate insulating film. Then, the ohmic contact layer and the active layer are secondarily patterned in such a manner as to reduce the thickness of the gate insulating film at a portion corresponding to the lower electrode. The source and drain electrodes are formed on the gate insulating film at the transistor area, and an upper electrode of the capacitor is formed at a portion corresponding to the lower electrode on the gate insulating film of the capacitor.

8 Claims, 3 Drawing Sheets

THIN FILM TRANSISTOR AND FABRICATING METHOD THEREOF

This application claims the benefit of Korean Patent Application No. P99-66040, filed on Dec. 30, 1999, the entirety of which is hereby incorporated by reference for all purposes as if fully set forth herein.

BACKGROUND OF THE INVENTION

1. Field of the Invention

This invention relates to a thin film transistor, and more particularly to a thin film transistor and a fabricating method thereof that is adaptive for increasing a capacitance of a storage capacitor.

2. Description of the Related Art

Generally, a liquid crystal display (LCD) includes switching devices consisting of thin film transistors having gate electrodes, a gate insulating film, an active layer, an ohmic contact layer and source and drain electrodes, and liquid crystal injected between a lower plate provided with pixel electrodes and an upper plate provided with color filters.

The thin film transistor (TFT) uses a storage capacitor so as to improve a sustaining characteristic of a liquid crystal application voltage and to stabilize a display of a gray scale. The storage capacitor can be classified into the storage on gate (SOG) system, in which a portion of the (n−1)th gate line is used as a lower electrode of a capacitor in the nth pixel, and the storage on common (SOC) system, in which a lower electrode of a capacitor is separately formed to be connected to a common electrode. Both the SOG system and the SOC system have such a structure that a gate insulating film provided between a lower electrode formed along with the gate electrode and an upper electrode formed along with the source and drain electrodes is used as a dielectric film.

FIGS. 1A to 1C show a process of fabricating a conventional TFT. Referring to FIG. 1A, an aluminum (Al) layer or a copper (Cu) layer, etc. is deposited on a transparent insulating substrate 11 including a transistor area T1 and a capacitor area C1 by the sputtering technique to form a metal thin film. Then, the metal thin film is patterned by photolithography, including a wet method, to form a gate electrode 13 at the transistor area T1 of the insulating substrate 11. At this time, the metal thin film also is patterned in such a manner to be left at the capacitor area C1 of the insulating film 11, thereby forming a lower electrode 15 of the capacitor. The lower electrode 15 consists of a gate line or a separate wire.

Referring to FIG. 1B, a gate insulating film 17, an active layer 19 and an ohmic contact layer 21 are sequentially formed on the insulating substrate 11 by the chemical vapor deposition (CVD) technique in such a manner as to cover the gate electrode 13 and the lower electrode 15 of the capacitor. The gate insulating film 17 is formed by deposition of an insulation material such as silicon oxide or silicon nitride, and the active layer 19 is formed from an amorphous silicon material or a polycrystalline silicon material that is not doped with an impurity. The ohmic contact layer 21 is made from amorphous silicon material or polycrystalline silicon material doped with an n-type or p-type impurity at a high concentration.

The ohmic contact layer 21 and the active layer 19 are patterned by photolithography, including an anisotropic etching in such a manner to be left only at a desired portion of the transistor area T1, to thereby expose the gate insulating film 17. At this time, the active layer 19 and the ohmic contact layer 21 are left only at a portion corresponding to the gate electrode 13.

Referring to FIG. 1C, a metal such as molybdenum (Mo), or a molybdenum alloy such as MoW, MoTa or MoNb, etc., is deposited on the gate insulating film 17 by the CVD or sputtering technique in such a manner as to cover an ohmic contact layer 21, thereby forming a metal thin film. The metal thin film makes an ohmic contact with the ohmic contact layer 21. Then, the metal thin film is patterned by the photolithography to expose the gate insulating film 13, thereby forming source and drain electrodes 23 and 25 at the transistor area T1. At this time, the metal thin film is patterned to be left at the capacitor area C1 in correspondence with the lower electrode 15, thereby forming an upper electrode 27 of the capacitor. In this case, the gate insulating film 17 between the lower electrode 15 and the upper electrode 27 formed at the capacitor area C1 makes a dielectric film. During the patterning for forming the source and drain electrodes 23 and 25 at the transistor area T1, the ohmic contact layer 21 at a portion corresponding to the gate electrode 13 between the source and drain electrodes 23 and 25 also is removed to expose the active layer 19.

As described above, in the conventional TFT fabricating method, the lower electrode, the dielectric film and the upper electrode of the storage capacitor are formed simultaneously upon formation of the gate electrode, the gate insulating film and the source and drain electrodes. As a result, the conventional TFT fabricating method has a problem in that, since the dielectric film of the storage capacitor is formed to have a thickness almost equal to the gate insulating film, it is difficult to increase the capacitance of the storage capacitor.

SUMMARY OF THE INVENTION

Accordingly, it is an object of the present invention to provide a thin film transistor and a fabricating method thereof that are adaptive for increasing a capacitance of the storage capacitor.

In order to achieve these and other objects of the invention, a thin film transistor according to one aspect of the present invention comprises a transparent insulating film including a transistor area and a capacitor area; a gate electrode and a lower electrode of a capacitor formed at the transistor area and the capacitor area of the insulating substrate, respectively; a gate insulating film formed on the insulating substrate to cover the gate electrode and the lower electrode, said gate insulating film has a large thickness at a portion corresponding to the gate electrode while having a small thickness at a portion including the capacitor area; an active layer formed at a portion corresponding to the gate electrode on the gate insulating film; an ohmic contact layer formed at each side of the active layer; source and drain electrodes formed on the gate insulating film to contact the ohmic contact layer; and an upper electrode formed at a portion corresponding to the lower electrode provided at the capacitor area on the gate insulating film.

A method of fabricating a thin film transistor according to another aspect of the present invention includes the steps of forming a gate electrode and a lower electrode of a capacitor at the transistor area and the capacitor area of an insulating substrate, respectively; sequentially forming a gate insulating film, an active layer and an ohmic contact layer on the insulating substrate to cover the gate electrode and the lower electrode; primarily patterning the ohmic contact layer and the active layer in such a manner to be left only at a portion corresponding to the gate electrode of the transistor area and thus expose the gate insulating film; secondarily patterning the ohmic contact layer and the active layer in such a manner to reduce a thickness of the gate insulating film at a portion corresponding to the lower electrode; and forming the source and drain electrodes on the gate insulating film at the transistor area and simultaneously forming an upper electrode of the capacitor at a portion corresponding to the lower electrode on the gate insulating film of the capacitor.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Figure 1A:
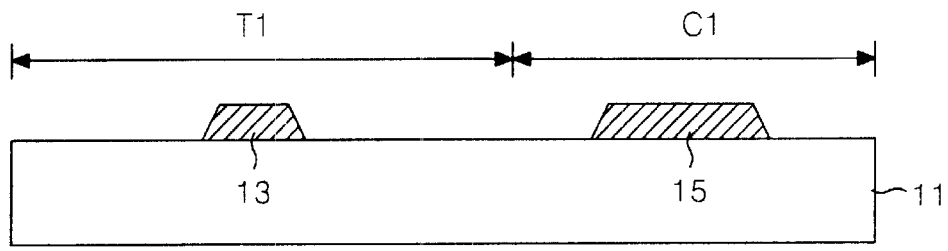
FIG. 1A to FIG. 1C are section views showing a process of fabricating a conventional thin film transistor.
Figure 1B:
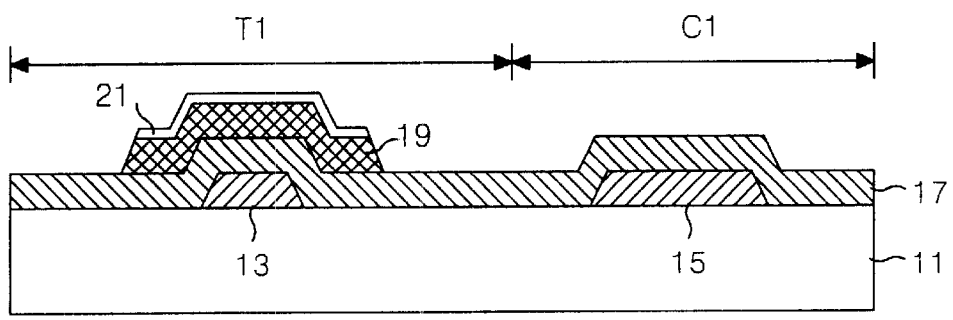
Figure 1C:
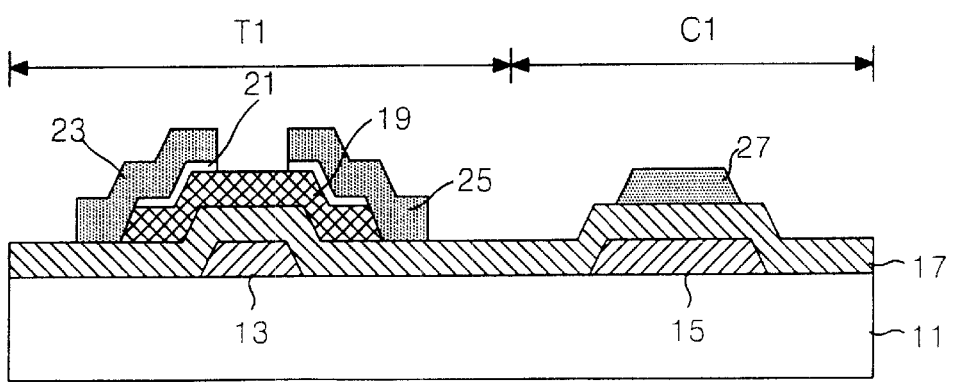
Figure 2:
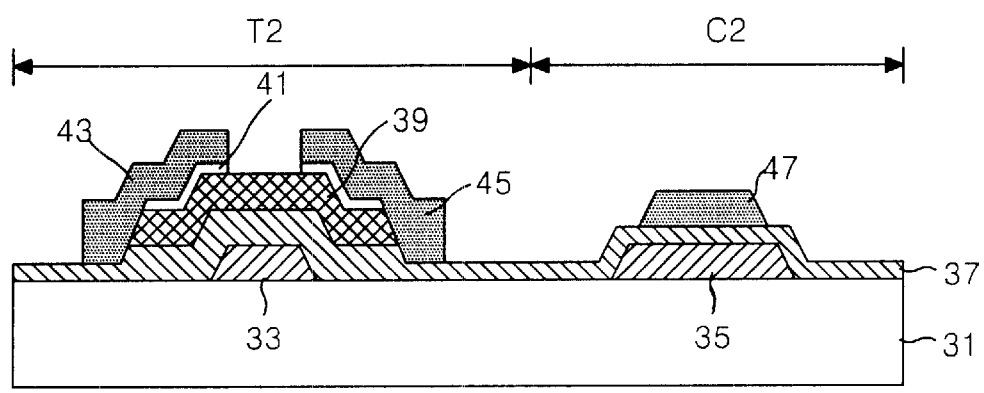
FIG. 2 is a section view showing a structure of a thin film transistor according to an embodiment of the present invention.

Referring to FIG. 2, there is shown a thin film transistor according to an embodiment of the present invention. In the thin film transistor, a transparent insulating substrate 31 is provided, including a transistor area T2 and a capacitor area C2. A gate electrode 33 is provided at a transistor area 32, and a lower electrode of a capacitor is provided at the capacitor area C2. The lower electrode 35 of the capacitor consists of a gate line or a separate wire. A gate insulating film 37 is formed on the insulating substrate 31 in such a manner as to cover the gate electrode 33 and the lower electrode 35 of the capacitor. The gate insulating film 37 is made from an insulating material such as silicon nitride or silicon oxide. The gate insulating film 37 has a thickness of about 3000 Å to 5000 Å at the portion corresponding to the gate electrode 33, while having a thickness of about 500 Å to 2500 Å at the remaining portion, including a portion corresponding to the lower electrode 35.

An active layer 39 is formed at a thick portion corresponding to the gate electrode 33 on the gate insulating film 37. An ohmic contact layer 41 is formed at each side of an area excluding a portion corresponding to the gate electrode 33 on the active layer 39. The active layer 39 is formed from an amorphous silicon material or polycrystalline silicon material that is not doped with an impurity to have a thickness of about 1500 Å to 2000 Å, and the ohmic contact layer 41 is formed from an amorphous silicon material or polycrystalline silicon material doped with an n-type or p-type impurity at a high concentration to have a thickness of about 200 Å to 500 Å. Source and drain electrodes 43 and 45 are provided on the gate insulating film 37 to cover the ohmic contact layer 41. An upper electrode 47 of the capacitor is formed at a portion corresponding to the lower electrode 35 on the gate insulating film 37. The source and drain electrodes 43 and 45 and the upper electrode 47 are formed from chrome (Cr) or molybdenum (Mo), or a molybdenum alloy such as MoW, MoTa or MoNb, etc. to have a thickness of about 1000 Å to 2000 Å.

The lower electrode 35, the gate insulating film 37 and the upper electrode 47 at the capacitor area C2 form a capacitor. In this case, since the thickness of the gate insulating film 37 used as a dielectric layer of the capacitor is reduced, the capacitance of the capacitor is increased.

Figure 3A:
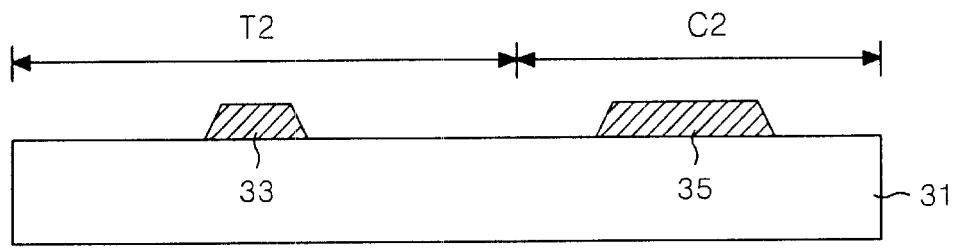
FIG. 3A to FIG. 3C are section views showing a process of fabricating a thin film transistor according to an embodiment of the present invention.
Figure 3B:
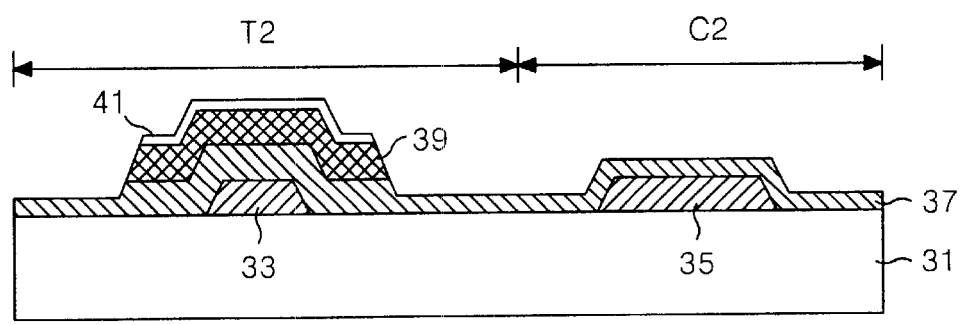
Figure 3C:
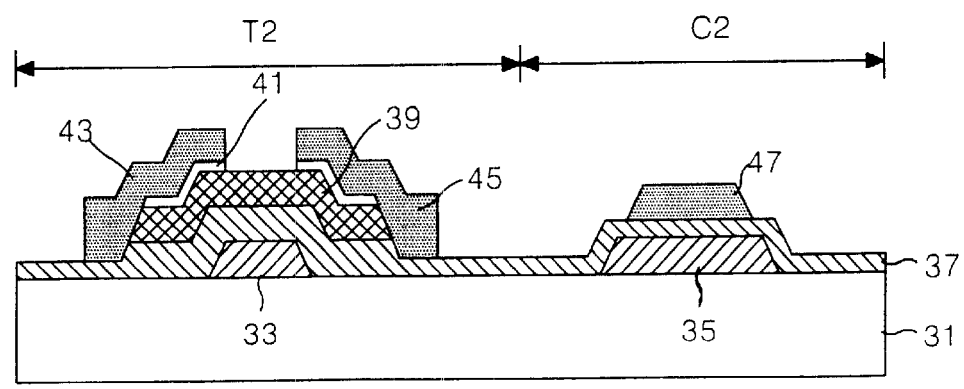

FIGS. 3A to 3C show a process of fabricating a TFT according to an embodiment of the present invention. Referring to FIG. 3A, an aluminum (Al) layer or a copper (Cu) layer, etc. is deposited on a transparent insulating substrate 31 including a transistor area T2 and a capacitor area C2 by the sputtering technique to form a metal thin film. Then, the metal thin film is patterned by photolithography including a wet method using $(NH_4)_2S_2O_8$, phosphoric acid, nitric acid, acetic acid or a mixture of phosphoric acid, acetic acid, nitric acid and water to form a gate electrode 33 at the transistor area T2 of the insulating substrate 31. At this time, the metal thin film also is patterned in such a manner as to be left at the capacitor area C2 of the insulating film 31, thereby forming a lower electrode 35 of the capacitor. The lower electrode 35 of the capacitor consists of a gate line or a separate wire.

Referring to FIG. 3B, a gate insulating film 37, an active layer 39 and an ohmic contact layer 41 are sequentially formed on the insulating substrate 31 by the chemical vapor deposition (CVD) technique in such a manner as to cover the gate electrode 33 and the lower electrode 35 of the capacitor. The gate insulating film 37 is formed by deposition of an insulation material such as silicon oxide or silicon nitride to a thickness of about 3000 Å to 5000 Å, and the active layer 39 is formed from an amorphous silicon material or a polycrystalline silicon material that is not doped with an impurity, to a thickness of about 1500 Å to 2000 Å. The ohmic contact layer 41 is formed by deposition of an amorphous silicon material or a polycrystalline silicon material doped with an n-type or p-type impurity at a high concentration to a thickness of about 200 Å to 500 Å.

The ohmic contact layer 41 and the active layer 39 are left only at a desired portion of the transistor area T2. A portion exposed by removal of the ohmic contact layer 41 and the active layer 39 on the gate insulating film 37 is patterned by photolithography including an anisotropic etching. The ohmic contact layer 41 and the active layer 39 are primarily patterned with a mixture of an F group gas and a Cl group gas in such a manner as to expose the gate insulating film 37. Subsequently, a desired thickness in the exposed portion of the gate insulating film 37 is secondarily patterned with a mixture of an F group gas and an $O_2$ gas instead of a Cl group gas. In this case, the secondary patterning allows the gate insulating film 37 to be removed by a thickness of about 500 Å to 2500 Å. The gate insulating film 37 positioned at a portion corresponding to the lower electrode 35 formed at the capacitor area C2 is used as a dielectric film of the capacitor and has a reduced thickness.

Referring to FIG. 3C, a metal such as molybdenum (Mo) or a molybdenum alloy such as MoW, MoTa or MoNb, etc. is deposited on the gate insulating film 37 to a thickness of about 1000 Å to 2000 Å by the CVD or sputtering technique in such a manner as to cover an ohmic contact layer 41, thereby forming a metal thin film. The metal thin film makes an ohmic contact with the ohmic contact layer 41. Then, the metal thin film is patterned by photolithography to expose the gate insulating film 37, thereby forming source and drain electrodes 43 and 45 at the transistor area T2. At this time, the metal thin film is patterned to be left at the capacitor area C2 in correspondence with the lower electrode 35, thereby forming an upper electrode 47 of the capacitor. In this case, the thickness of a dielectric film consisting of the gate insulating film 37 between the lower electrode 35 and the upper electrode 47 formed at the capacitor area C2 is reduced, so that the capacitance of the capacitor can be increased.

During the patterning for forming the source and drain electrodes 43 and 45 at the transistor area T2, the ohmic contact layer 41 at a portion corresponding to the gate electrode 33 between the source and drain electrodes 43 and 45 also is removed to expose the active layer 39.

As described above, in the method of fabricating the thin film transistor according to the present invention, when the ohmic contact layer and the active layer are patterned in such a manner as to be left only at a desired portion of the transistor area, the gate insulating film also is etched and thus removed by a thickness of about 500 Å to 2500 Å, so that the thickness of the gate insulating film used as a dielectric film at a portion corresponding to the lower electrode formed at the capacitor area is reduced. Accordingly, the present TFT fabricating method has an advantage in that the capacitance of the capacitor can be increased.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A thin film transistor comprising:
   an insulating substrate including a transistor area and a capacitor area;
   a gate electrode and a lower electrode of a capacitor formed at the transistor area and the capacitor area of the insulating substrate, respectively;
   a gate insulating film formed on the insulating substrate to cover the gate electrode and the lower electrode, said gate insulating film having a thickness which is greater at a portion corresponding to the gate electrode than at a portion covering the lower electrode;
   an active layer formed on the gate insulating film at a portion corresponding to the gate electrode;
   an ohmic contact layer formed at each side of the active layer;
   source and drain electrodes formed on the gate insulating film to contact the ohmic contact layer; and
   an upper electrode formed on the gate insulating film at a portion corresponding to the lower electrode provided at the capacitor area.

2. The thin film transistor according to claim 1, wherein the lower electrode of the capacitor consists of one selected from the group consisting of a gate line and a separate wire.

3. The thin film transistor according to claim 1, wherein the gate insulating film has a thickness of 3000 Å to 5000 Å at the portion corresponding to the gate electrode.

4. The thin film transistor according to claim 1, wherein the gate insulating film has a thickness of 500 Å to 2500 Å at the portion covering the lower electrode.

5. A device formed on an insulating substrate, comprising:
   a thin film transistor, comprising,
      a gate electrode formed on the insulating substrate,
      a first portion of an insulating film formed on the gate electrode,
      an active layer formed on the first portion of the insulating film to define a channel region,
      an ohmic contact layer formed on at least a portion of the active layer, and
      source and drain electrodes spaced apart and each contacting the ohmic contact layer; and
   a capacitor, comprising,
      a first electrode formed on the insulating substrate,
      a second portion of the insulating film formed on the first electrode, and
      a second electrode formed on the second portion of the gate insulating film,
   wherein a thickness of the second portion of the insulating film is less than a thickness of the first portion of the insulating film.

6. The device of claim 5, wherein the thickness of the first portion of the insulating film is in a range of about 3000 Å to 5000 Å.

7. The device of claim 5, wherein the thickness of the second portion of the insulating film is in a range of about 500 Å to 2500 Å.

8. The device of claim 7, wherein the thickness of the first portion of the insulating film is in a range of about 3000 Å to 5000 Å.

* * * * *